(12) United States Patent
Sher

(10) Patent No.: US 6,445,644 B2
(45) Date of Patent: Sep. 3, 2002

(54) APPARATUS AND METHOD FOR GENERATING A CLOCK WITHIN A SEMICONDUCTOR DEVICE AND DEVICES AND SYSTEMS INCLUDING SAME

(75) Inventor: Joseph C. Sher, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/747,568

(22) Filed: Dec. 21, 2000

Related U.S. Application Data

(63) Continuation-in-part of application No. 09/081,983, filed on May 20, 1998, now Pat. No. 6,169,704.

(51) Int. Cl.$^7$ .................................................. G11C 8/00
(52) U.S. Cl. ...................................... 365/233; 365/194
(58) Field of Search ................................ 365/233, 194, 365/189.05

(56) References Cited

U.S. PATENT DOCUMENTS

| | | |
|---|---|---|
| 4,727,519 A | 2/1988 | Morton et al. |
| 4,761,568 A | 8/1988 | Stronski |
| 5,204,555 A | 4/1993 | Graham et al. |
| 5,272,729 A | 12/1993 | Bechade et al. |
| 5,440,250 A | 8/1995 | Albert |
| 5,757,218 A | 5/1998 | Blum |
| 5,812,462 A | 9/1998 | Merritt |
| 6,169,704 B1 * | 1/2001 | Sher .......................... 365/233 |

* cited by examiner

Primary Examiner—David Nelms
Assistant Examiner—Thong Le
(74) Attorney, Agent, or Firm—TraskBritt

(57) ABSTRACT

A clock generator which provides a stable, programmable pulse width output clock signal based on an input clock signal. The clock generator provides a leading edge of an output clock signal in response to a leading edge of an input clock signal. The trailing edge of the output clock signal is conditioned on feedback of the leading edge output clock signal with the trailing edge of the input signal.

36 Claims, 8 Drawing Sheets

APPARATUS AND METHOD FOR GENERATING A CLOCK WITHIN A SEMICONDUCTOR DEVICE AND DEVICES AND SYSTEMS INCLUDING SAME

CROSS-REFERENCE TO RELATED APPLICATION

This application is a continuation-in-part of application Ser. No. 09/081,983, filed May 20, 1998, now U.S. Pat. No. 6,169,704 B1, issued Jan. 2, 2001.

BACKGROUND OF THE INVENTION

1. Technical Field

This invention relates in general to semiconductor devices, such as semiconductor memory devices, and, more specifically, to devices and methods for generating a clock within a semiconductor device, such as an internal clock for a Synchronous Dynamic Random Access Memory (SDRAM).

2. State of the Art

Most conventional DRAMs have an asynchronous timing relationship with the electronic components they interact with. The recently popular SDRAMs, on the other hand, are generally synchronized with the electronic components they interact with through the use of one or more shared clocks.

Within a typical SI)RAM, shared clocks are used to latch signals in and out of the SDRAM and to time a wide variety of other internal operations. Since signals appearing at the inputs of the typical SDRAM take some time to rise or fall to their maximum or minimum potential, the shared clocks used by the SDRAM typically have to be delayed within the SDRAM before being used to latch input signals. This delay time is selected to allow the input signals sufficient time to stabilize at the inputs to the SDRAM.

The circuit used to delay a shared clock within an SDRAM is typically referred to as a "clock generator" or simply as a "generator." One such prior art generator 10 is shown in FIG. 1. As shown, the generator 10 includes an inverting input buffer 12, an inverting latch 14, a clock rising edge path 16, a clock falling edge path 18, and a switching circuit 29.

In a steady state of the generator 10, a low external clock XCLK provided to an SDRAM (not shown) causes the input buffer 12 to output a high. At the same time, an inverter 20 makes the inputs to a NAND gate 22 complementary, which causes the NAND gate 22 to output a high. The highs from the input buffer 12 and the NAND gate 22 cause another NAND gate 24 to output a low which, in turn, causes an inverter 26 to output a high, an inverter 28 to output a low, a NAND gate 30 to output a high, and an inverter 32 to output a low SDRAM internal clock CLKA. The low output from the NAND gate 24 also causes the inverter 20 to output a high which, in turn, causes a NOR gate 34 to output a low, an inverter 36 to output a high, an inverter 38 to output a low, an inverter 40 to output a high, and an inverter 42 to output a low.

In general, when the external clock XCLK pulses high, the rising edge path 16 responds by causing the switching circuit 29 to pulse the internal clock CLKA high after a brief delay, and the falling edge path 18 responds by later causing the switching circuit 29 to pull the internal clock CLKA low after a slightly longer delay. This provides a clock pulse on the internal clock CLKA for each pulse on the external clock XCLK.

More specifically, the input buffer 12 outputs a low in response to the high external clock XCLK which, in turn, causes the NAND gate 24 to output a high, the inverter 26 to output a low, and the inverter 28 to output a high. The highs from the inverters 28 and 40 then cause the NAND gate 30 to output a low, which causes the inverter 32 to pulse the SDRAM internal clock CLKA high as described above. The delay time (Atr) between the rising edge of the external clock XCLK and the rising edge of the SDRAM internal clock CIKA, caused by delays associated with the input buffer 12, the latch 14, the clock rising edge path 16, and the switching circuit 29, gives input signals provided to the SDRAM time to develop at the inputs of the SDRAM before being latched into the SDRAM by the SDRAM internal clock CLKA.

Also, while the switching circuit 29 is pulsing the internal clock CLKA high, the high output by the NAND gate 24 causes the inverter 20 to output a low which, after propagating through several delay elements 44, causes the NOR gate 34 to output a high, the inverter 36 to output a low, the inverter 38 to output a high, the inverter 40 to output a low, and the inverter 42 to output a high. The low from the inverter 40 causes the NAND gate 30 to output a high which, in turn, causes the inverter 32 to pull the internal clock CLKA low. At the same time, the high output by the inverter 42 activates a pull-down NMOS transistor 46 which helps the inverter 32 pull the internal clock CLKA low. The delay time ($\Delta t_f$) associated with the input buffer 12, the latch 14, the falling edge path 18, and the switching circuit 29 is greater than the delay time ($\Delta t_r$) associated with the rising edge path 16, which allows the falling edge path 18 to pull the internal clock CLKA low after the rising edge path 16 pulses the internal clock CLKA high, thereby creating a delayed pulse on the internal clock CLKA for each pulse on the external clock XCLK.

Unfortunately, under certain extreme temperature and/or supply voltage conditions, the delay $\Delta t_f$ associated with the falling edge path 18 can decrease just enough, and the delay $\Delta t_r$ associated with the rising edge path 16 can increase just enough, that the falling edge path 18 pulls the internal clock CLKA low too soon after the rising edge path 16 pulses the internal clock CLKA high, or even before the rising edge path 16 pulses the internal clock CLKA high. in response to the external clock XCLK pulsing high. As a result, the generator 10 outputs an unrecognizable internal clock CLKA. This occurs because process variations between the various components that make up the two paths 16 and 18 can cause these paths 16 and 18 to respond differently to temperature and supply voltage variations.

Therefore, there is a need in the art for an improved clock generator that produces a recognizable internal clock even under such extreme temperature and supply voltage variations.

BRIEF SUMMARY OF THE INVENTION

To overcome the problem of generating a stable and recognizable internal clock signal under extreme operating conditions of temperature and/or supply voltage, the method and apparatus of the present invention utilizes a latch, a switching circuit and a feedback path, where the switching circuit is interposed between the latch and the feedback path.

In the leading edge phase of the input clock signal, the latch element takes the leading edge of the input clock signal and presents that signal on its output. The switching circuit drives the output clock signal leading edge based on the latch output. The feedback path couples and selectively delays the output clock signal back to the latch and the switching circuit, which in turn, drive the trailing edge of the output clock signal. The trailing edge of the output clock signal will not occur unless the leading edge of the output signal has occurred first. During the trailing edge phase of the input clock signal, the latch and the switching circuit are returned to their initial states. Once the initial states have been reset, the clock generator circuit is ready for the next input clock signal.

The clock generator of the present invention provides an internal clock pulse that corresponds to each pulse on an external clock. The internal clock pulse may be recognizable under even the most extreme temperature and/or supply voltage variations because the clock generator does not drive the internal clock low until it first senses, through feedback, that the internal clock has been driven high.

The clock generator of the present invention is suitable for memory circuits, pulse generators, Address Transition Detection circuitry, and any other circuit or electronic system in which a stable output pulse is to be generated from an input pulse signal. The inventive clock generator can be fabricated using conventional techniques on any suitable substrate. These and other embodiments and advantages of the invention will be readily understood by reading the following detailed description in conjunction with the accompanying figures of the drawings.

BRIEF DESCRIPTION OF THE DRAWINGS

In the drawings, which illustrate what is currently regarded as the best mode for carrying out the invention and in which like reference numerals refer to like parts in different views or embodiments.

DETAILED DESCRIPTION OF THE INVENTION

Figure 2:
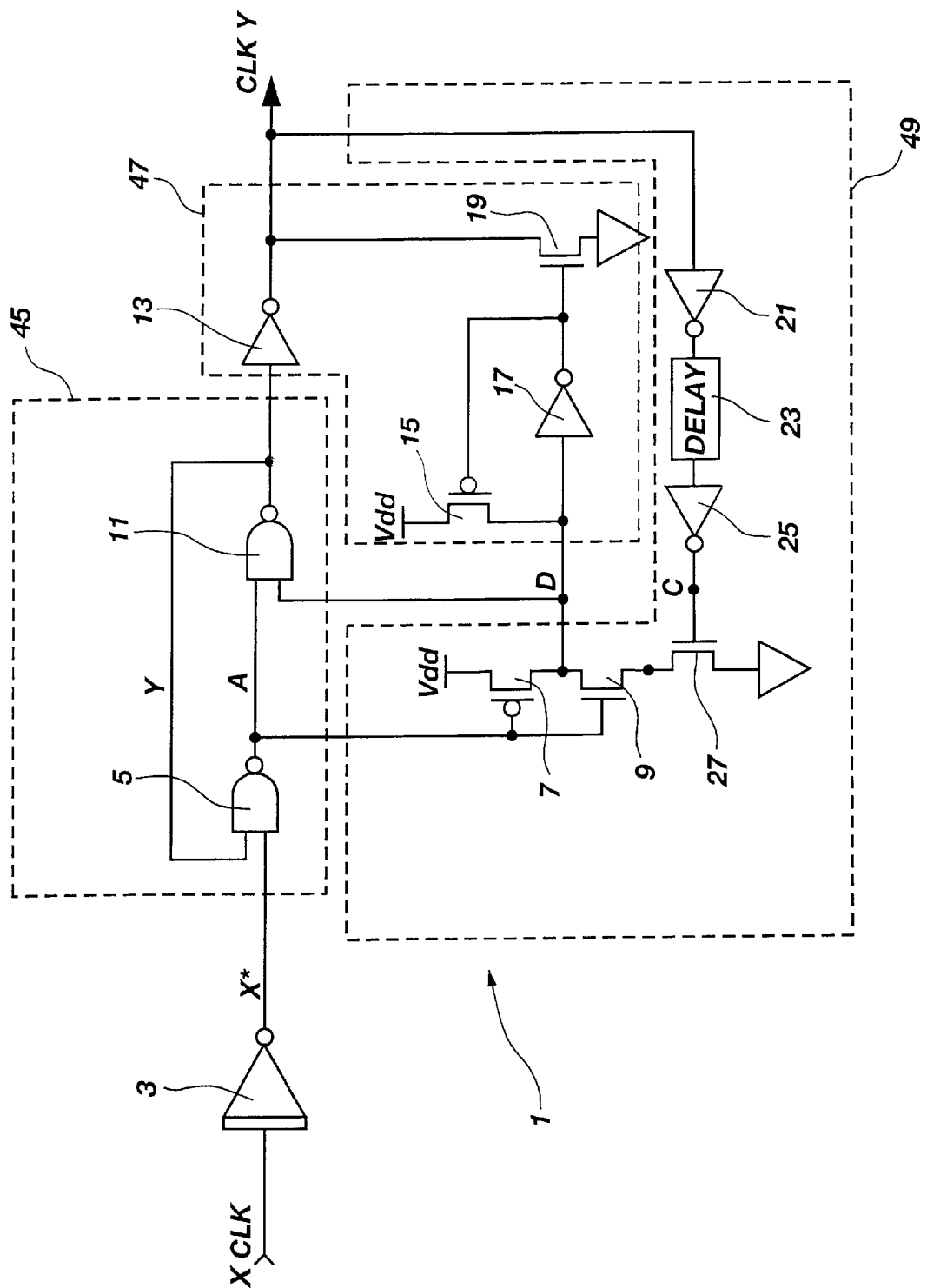
FIG. 2 is a circuit schematic illustrating a clock generator in accordance with this invention.
Figure 3:
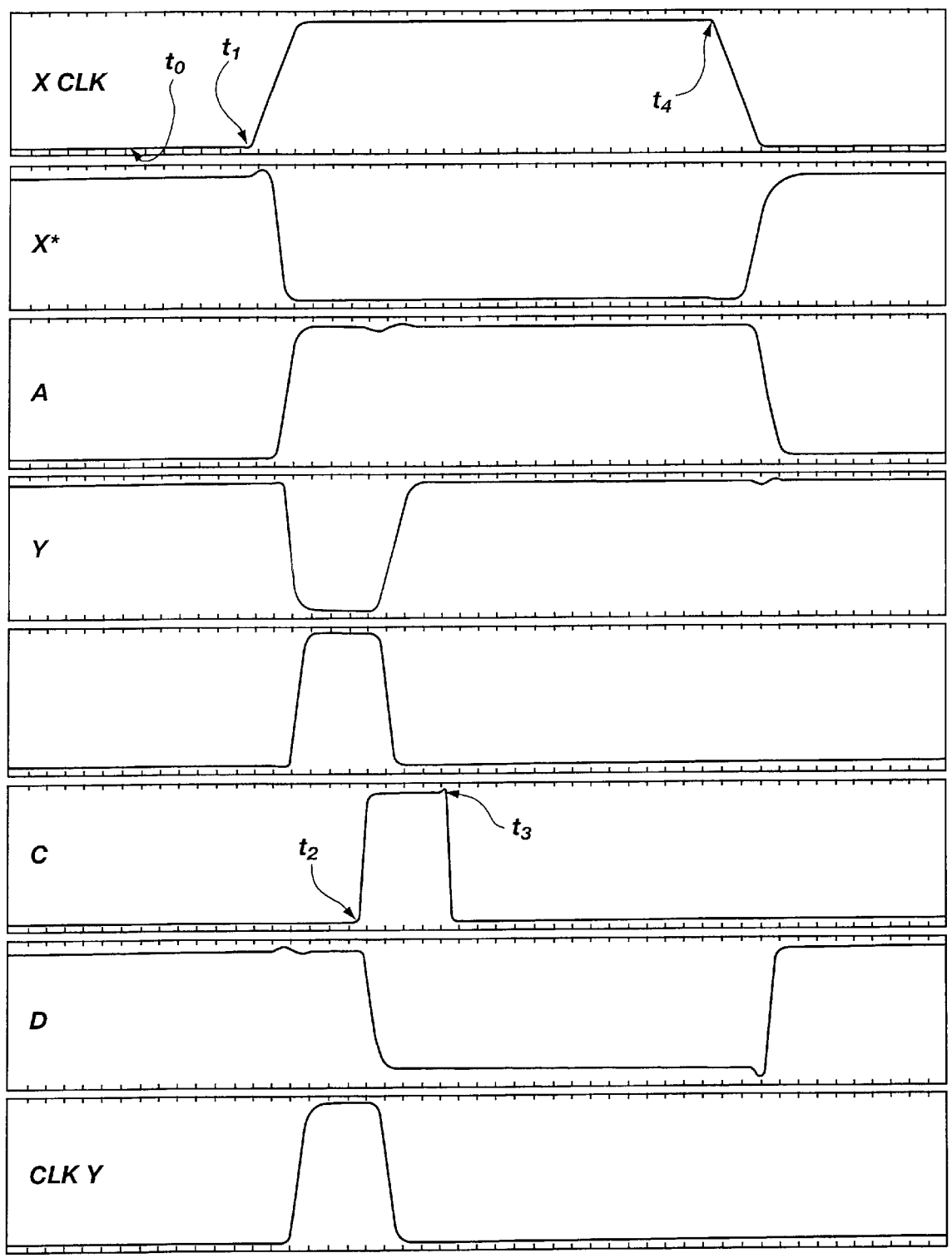
FIG. 3 is a timing diagram illustrating the operation of the clock generator of FIG. 2.

Referring to FIGS. 2 and 3, in a steady state at a time to, an inventive SDRAM clock generator 1 receives a low external clock XCLK, which causes an inverting input buffer 3 to output a high clock X*. Although this invention will be described in connection with an SDRAM, it will be understood by those having ordinary skill in the technical field of this invention that the invention is applicable to a wide variety of other semiconductor devices, including conventional memory device architectures such as dynamic random access memory (DRAM), double data rate SDRAM (DDR SDRAM), RAMBUS® DRAM (RDRAM®), extended data-out DRAM (EDO DRAM), fast-page-mode DRAM (FPM DRAM), static random access memory (SRAM), SyncBurst™ SRAM, Zero Bus Turnaround™ SRAM (SBT™ SRAM), Quad Data Rate™ SRAM (QDR™ SRAM), DDR synchronous SRAM (DDR SRAM) and nonvolatile electrically block-erasable programmable read only memory (Flash). Also, it will be understood that the circuit disclosed in FIG. 2 may be used in a wide variety of signal delay applications as a delay element or buffer and, in particular, may be adapted for use as a signal generator in an Address Transition Detection (ATD) circuit in a semiconductor memory. The terms "power", "power source", "high voltage potential" and "Vdd" may be used interchangeably herein and refer to a "higher" voltage power source which is logically "high", "true" or "1". The terms "ground", "ground potential", "GND" and "Vss" may be used interchangeably herein and refer to "lower" voltage source which is logically "low", "false" or "0".

As will be described in more detail below, by design, the generator 1 cannot maintain its output—an internal SDRAM clock CLKY—in a high state for an extended period of time. Rather, the generator 1 is only able to pulse the clock CLKY high for brief periods of time before the clock CLKY is pulled low again. Therefore, in steady state, the internal SDRAM clock CIKY is low.

Accordingly, because the clock CLKY is low in steady state, the input Y to an inverter 13, and the output Y of a NAND gate 11, is high which, in combination with the high clock X*, causes a NAND gate 5 to output a low at its output A, thereby turning on a PMOS transistor 7 and pulling a node D high. The high on the node D causes an inverter 17 to output a low which, in turn, turns on a PMOS transistor 15, which then helps maintain the high on the node D. Also, the low clock CLKY causes an inverter 21 to output a high which, in turn, causes an inverter 25 to output a low at its output C.

When the external clock XCLK transitions high at a time $t_1$ (see FIG. 3), the input buffer 3 outputs a low clock X*, thereby causing the output A of the NAND gate 5 to go high. In combination with the high on node D, the high at the output A causes the NAND gate 11 to output a low at its output Y which, in turn, causes the inverter 13 to pulse the clock CLKY high.

The high clock CLKY causes the inverter 21 to output a low which, after being delayed by a delay element 23, causes the inverter 25 to output a high at its output C at a time $t_2$ (see FIG. 3), thereby turning on an NMOS transistor 27. At the same time, the high output A of the NAND gate 5 has the PMOS transistor 7 turned off and an NMOS transistor 9 turned on, so that node D is pulled low through NMOS transistors 9 and 27.

When the node D transitions low, the inverter 17 outputs a high which turns the PMOS transistor 15 off and turns an NMOS transistor 19 on, thereby pulling the clock CLKY low. At the same time, the transition of the node D low causes the output Y of the NAND gate 11 to go high., thereby causing the inverter 13 to assist the clock CLKY in transitioning low. The transition of the clock CLKY low causes the inverter 21 to output a high which, after the delay caused by the delay element 23, causes the inverter 25 to output a low at its output C at a time $t_3$ (see FIG. 3), thereby turning the NMOS transistor 27 off.

No further signal changes occur until the external clock XCLK transitions back to low at a time $t_4$ (see FIG. 3), thereby causing the input buffer 3 to drive the clock X* high. The high clock X* drives the output A of the NAND gate 5 low which, in turn, turns on the PMOS transistor 7 and turns off the NMOS transistor 9, thus pulling the node D high through the PMOS transistor 7. At this point, a complete clock cycle has taken place and the generator 1 has returned to its steady state condition previously described.

It should be understood that the NAND gates 5 and 11 may be referred to collectively as a "latch" or a "Set-Reset (SR) flip-flop" 45, that the inverters 13 and 17 and the transistors 15 and 19 may be referred to collectively as a "switching circuit 47," that the transistors 7, 9, and 27, the inverters 21 and 25, and the delay element 23 may be referred to collectively as a "falling edge feedback path" 49, and that the inverter 13 may be referred to individually as a "delay element" or "delay path." It should also be understood that additional delay elements may be added to the clock generator 1, such as between the latch 45 and its input to the switching circuit 47, to increase the delay time between transitions of the clocks XCLK and CLKY Further, it should be understood that, as used herein, "leading" edge is synonymous with "rising" edge, and "trailing" edge is synonymous with "falling" edge. However, if either of the clocks CLKY and XCLK was a low-pulsing signal rather than the high-pulsing signals shown in FIG. 3, then, with respect to that low-pulsing signal, "leading" edge would be synonymous with "falling" edge, and "trailing" edge would by synonymous with "rising" edge.

The inventive clock generator thus provides an internal clock pulse that corresponds to each pulse on an external clock. The internal clock pulse is recognizable under even the most extreme temperature and supply voltage variations because the clock generator does not drive the internal clock low until it first senses through feedback that the internal clock has been driven high. The invention therefore avoids the problems associated with the conventional generator previously described. It should also be noted that the inventive clock generator includes fewer circuit elements than the conventional clock generator previously described, and is therefore more power efficient and requires less die "real estate."

Figure 4:
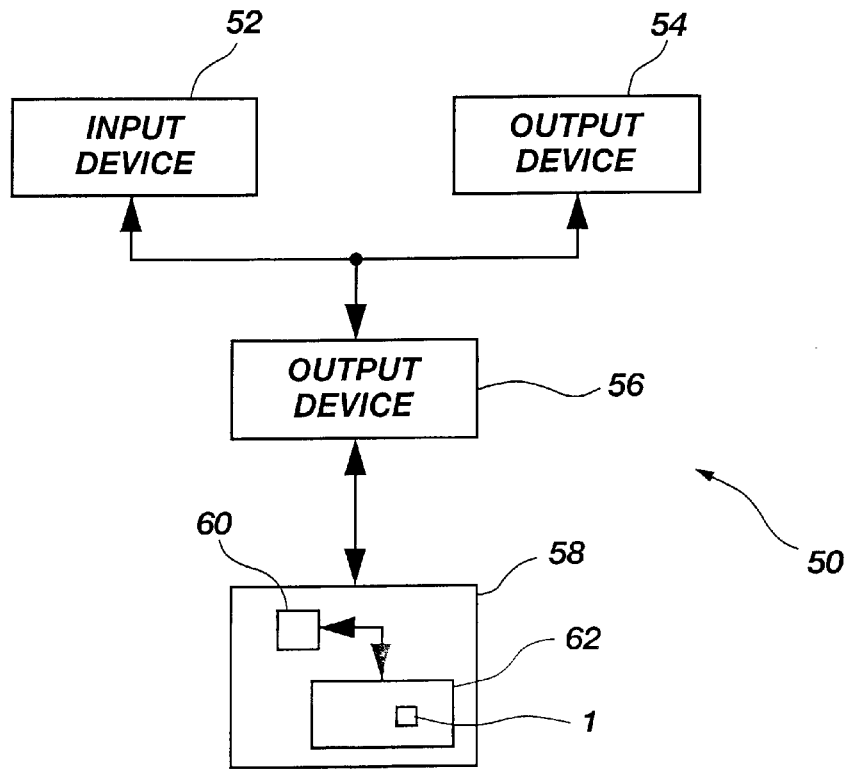
FIG. 4 is a block diagram illustrating an electronic system that includes a memory device incorporating a memory controller and a Synchronous Dynamic Random Access Memory (SDRAM) that includes the clock generator of FIG. 2.

Referring to FIG. 4, an electronic system 50 includes an input device 52, an output device 54, a processor device 56, and a memory device 58 that includes a memory controller 60 interacting with an SDRAM 62 incorporating the clock generator 1 of FIG. 2. Of course, it will be understood that the clock generator 1 may be incorporated into any one of the input, output, processor, and memory devices 52, 54, 56, and 58.

Figure 5:
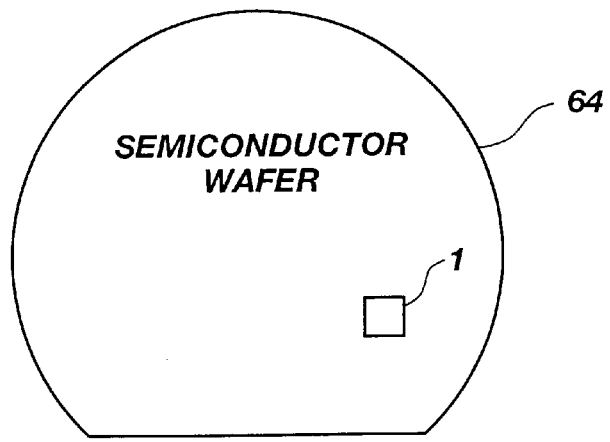
FIG. 5 is a diagram illustrating a semiconductor wafer on which the clock generator of FIG. 2 is fabricated.

Referring to FIG. 5, the clock generator 1 of FIG. 2 is fabricated on the surface of a semiconductor wafer 64. Of course, it will be understood that the inventive clock generator 1 may be fabricated on other semiconductor substrates, as well, including, for example, Silicon-on-Glass (SOG) substrates, Silicon-on-Insulator (SOI) substrates, and Silicon-on-Sapphire (SOS) substrates. Silicon is one preferred semiconductor material, although gallium arsenide and indium phosphide substrates may also be employed.

Figure 1:
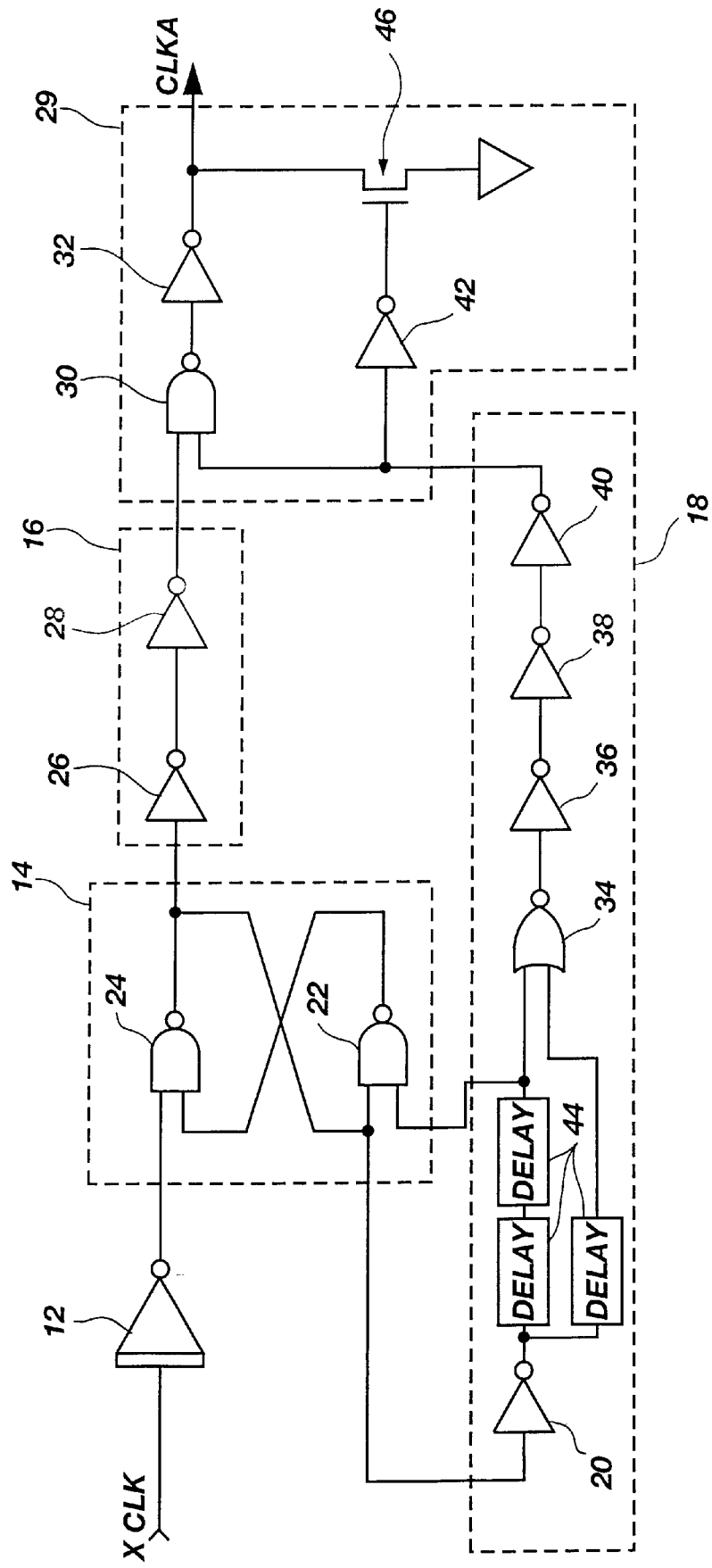
FIG. 1 is a circuit schematic illustrating a conventional clock generator.
Figure 6:
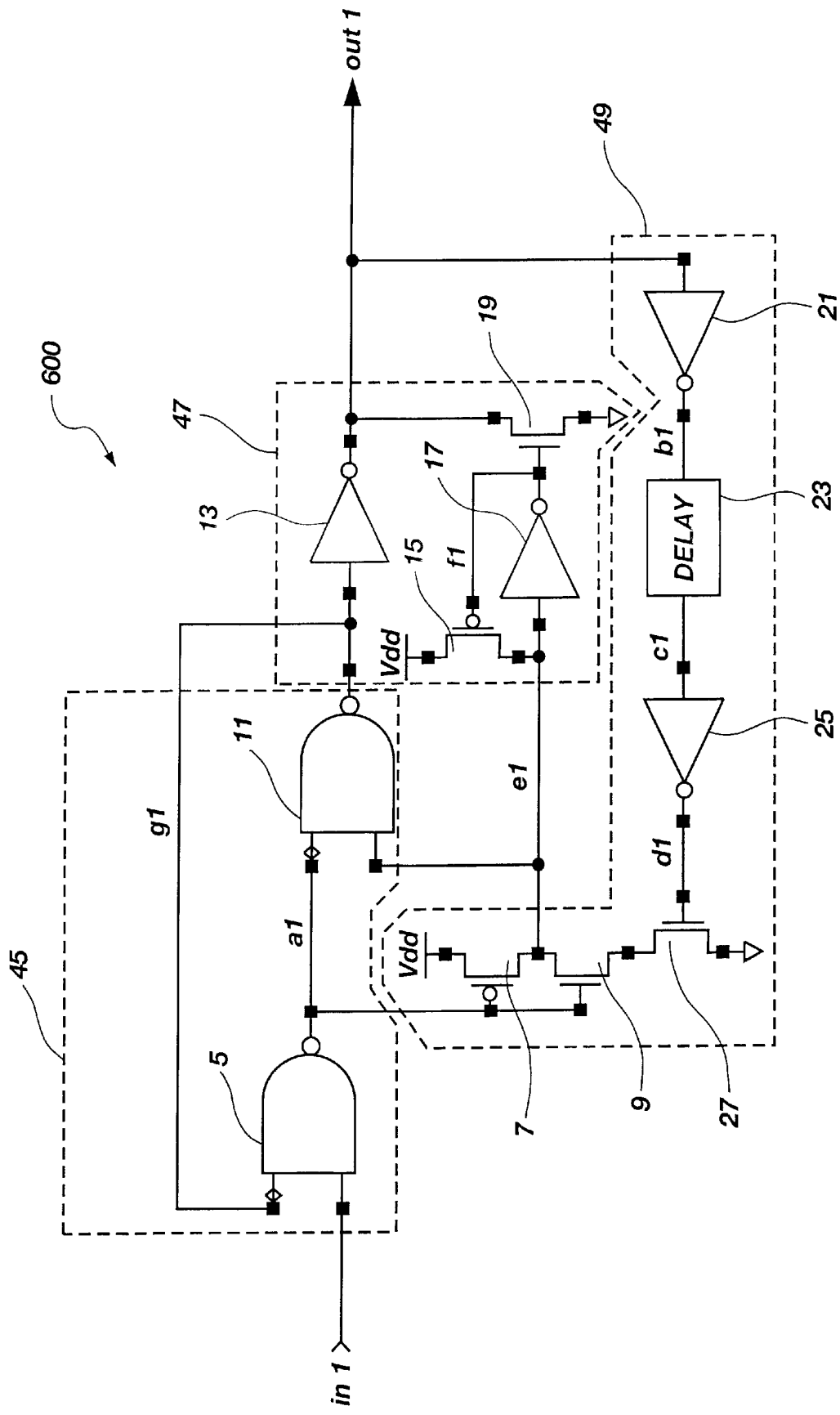
FIG. 6 is a circuit schematic illustrating another embodiment of a clock generator in accordance with this invention.
Figure 7:
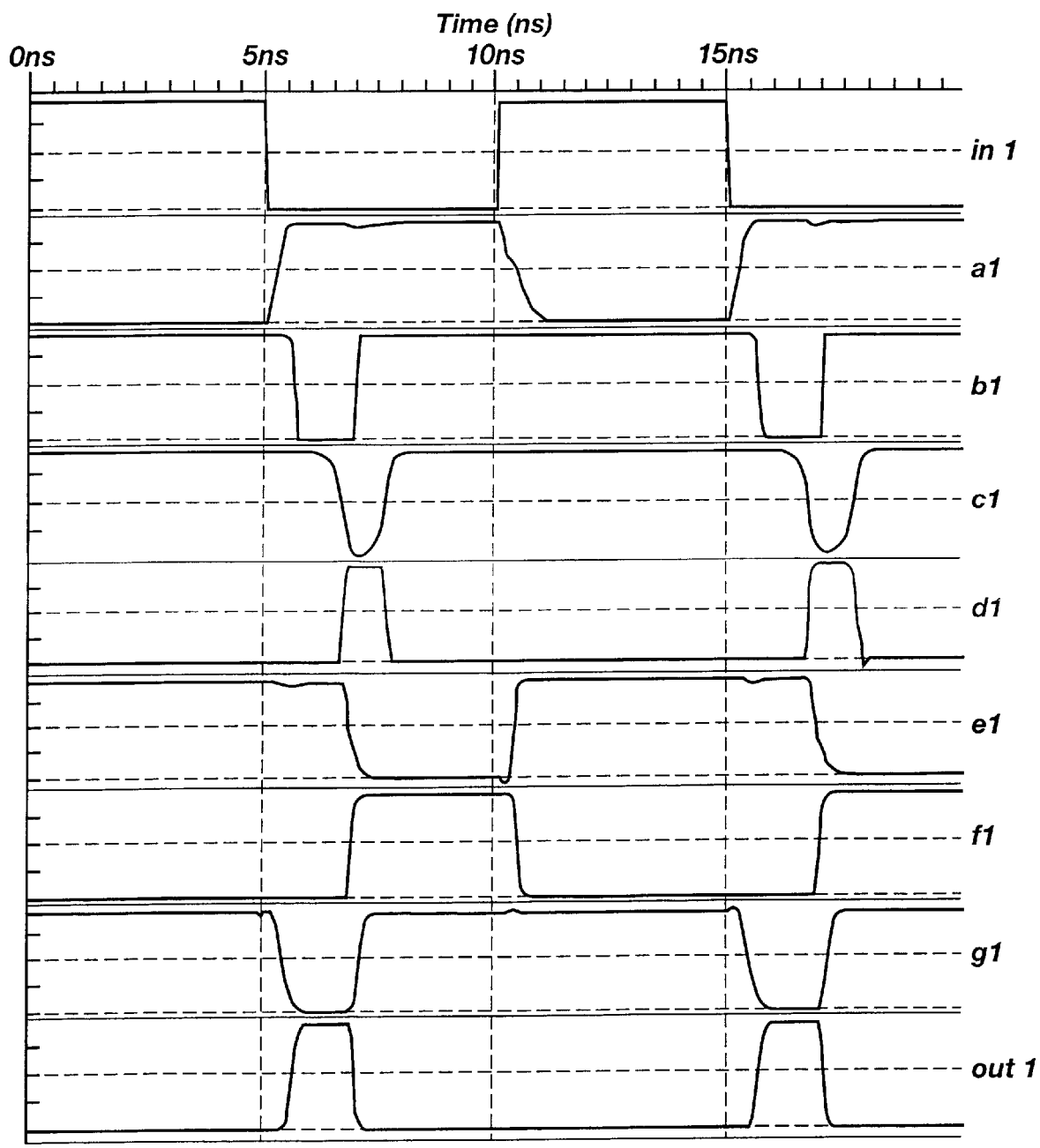
FIG. 7 is a timing diagram illustrating the operation of the clock generator of FIG. 6.

FIG. 6 is a circuit diagram of another embodiment of a clock generator 600 in accordance with the present invention. FIG. 7 is a timing diagram associated with the clock generator 600 of FIG. 6. The clock generator 600 shown in FIG. 6 is identical to the clock generator 1 in FIG. 1 except that inverting input buffer 3 has been removed. FIG. 7 illustrates timing for input signal in1, nodes a1, b1, c1, d1, e1, f1, g1 and output signal out1, as referenced on the schematic of clock generator 600 in FIG. 6. As clock generator 600 operates in a manner analogous to clock generator 1, except that the input signal in1 is not inverted with an inverting input buffer, no further explanation is necessary for one of ordinary skill in the art. One advantage of clock generator 600 versus the SDRAM clock generator 1 is the reduced component count by not including the inverting input buffer 3.

Figure 8:
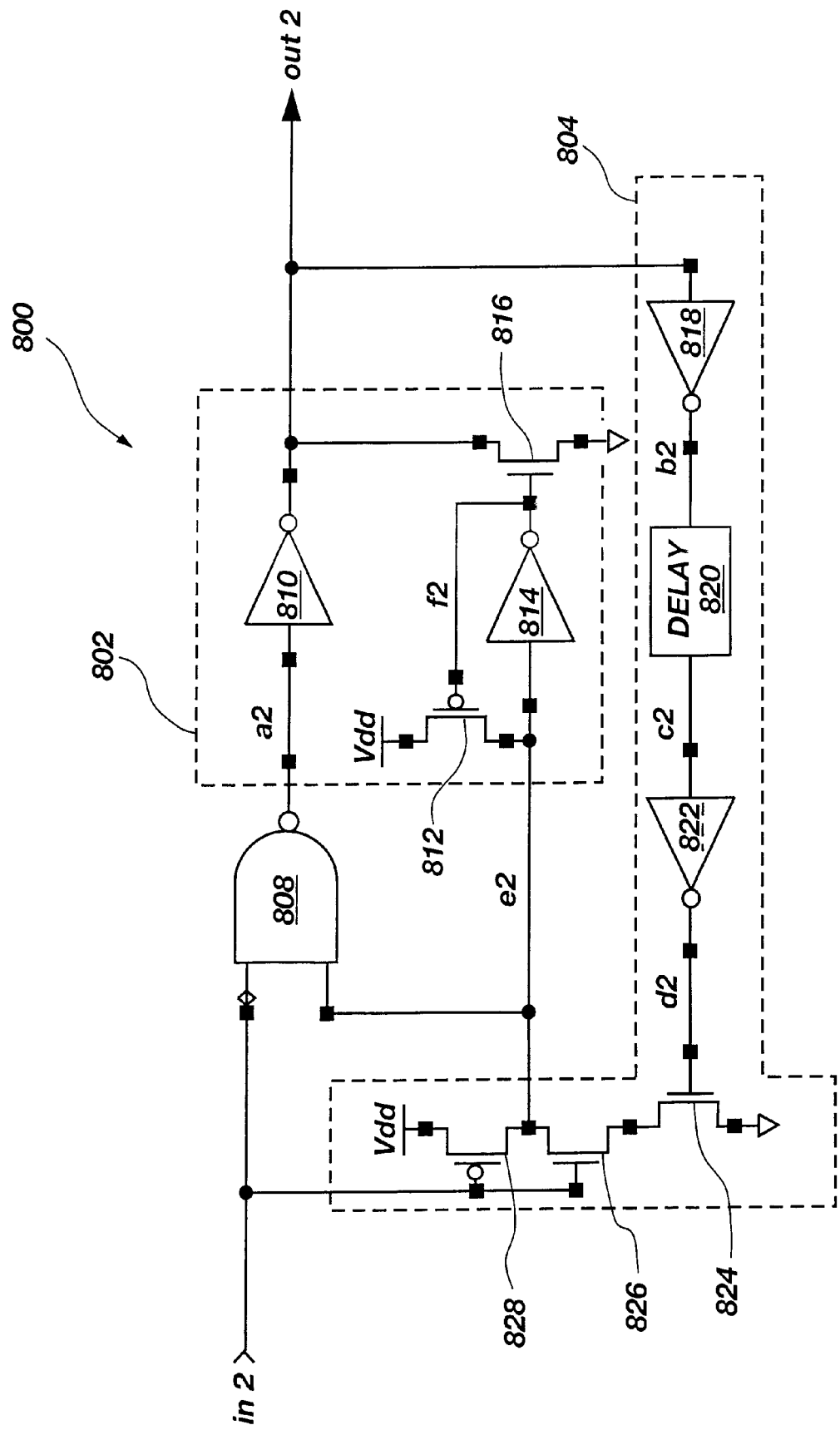
FIG. 8 is a circuit schematic illustrating yet another embodiment of a clock generator in accordance with this invention.
Figure 9:
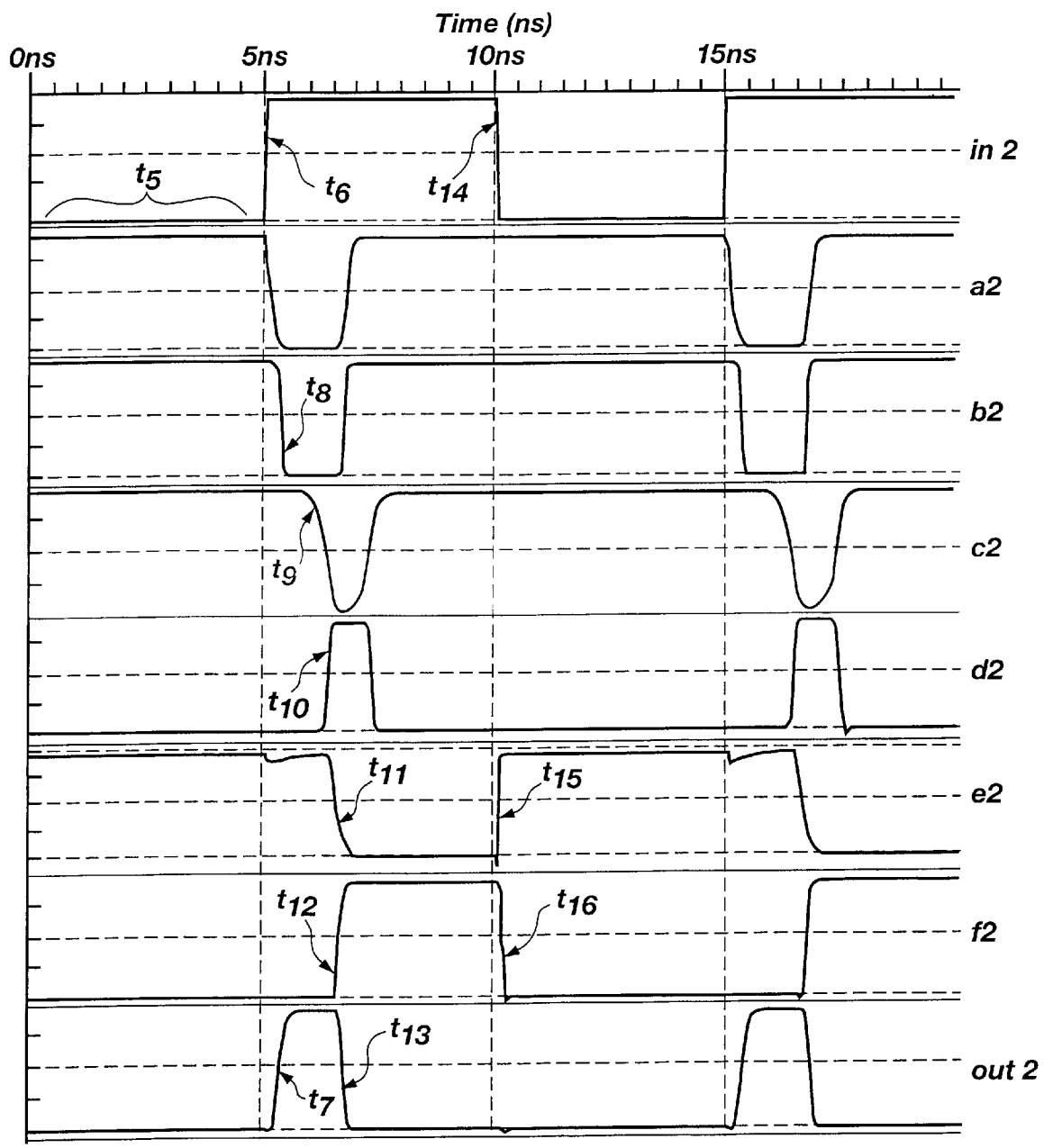
FIG. 9 is a timing diagram illustrating the operation of the clock generator of FIG. 8.

FIG. 8 is circuit diagram of yet another embodiment of a clock generator 800 in accordance with the present invention. FIG. 9 is a timing diagram associated with the clock generator 800 of FIG. 8. Clock generator 800 includes NAND gate 808, inverters 810, 814, 818 and 822, NMOS transistors 816, 824 and 826, and PMOS transistors 812 and 828. Collectively, inverters 810 and 814, PMOS transistor 812 and NMOS transistor 816 may be referred to as "switching circuit 802". Additionally, inverters 818 and 822, delay element 820, NMOS transistors 824 and 826, and PMOS transistor 828 may be collectively referred to as "feedback path 804".

NAND gate 808 is connected at a first input to input signal, in2, and at a second input to node e2. The output of NAND gate 808, also referred to as node a2, is connected to the input of inverter 810. The output of inverter 810 is also referred to as output signal out2. Output signal out2 is connected to the input of inverter 818. The output of inverter 818 is also referred to as node b2, which in turn, is connected to the input of delay element 820. The output of delay element is referred to as node c2, which in turn, is connected to the input of inverter 822. The output of inverter 822 is referred to as node d2, which is connected to the gate of NMOS transistor 824. The source of NMOS transistor 824 is connected to ground potential. The drain of NMOS transistor 824 is connected to the source of NMOS transistor 826. The drain of NMOS transistor 826 is referred to as node e2 and connected to the drain of PMOS transistor 828. The source of PMOS transistor 828 is connected to a high voltage potential, or Vdd. The gates of both PMOS transistor 828 and NMOS transistor 826 are connected to input signal in2.

Node e2 is connected to the input of inverter 814. The output of inverter 814 is node f2 and is also connected to the gate of NMOS transistor 816. The source of NMOS transistor 816 is connected to ground potential. The drain of NMOS transistor 816 is connected to output signal out2. Node f2 is connected to the gate of PMOS transistor 812. The source of PMOS transistor 812 is connected to a high voltage potential, or Vdd. The drain of PMOS transistor 812 is connected to node e2.

Referring to FIGS. 8 and 9, at steady state during time $t_5$, input signal in2, nodes d2 and f2 and output signal out2 are low, nodes a2, b2, c2 and e2 are high, transistors 816, 824 and 826 are off and transistors 812 and 828 are on. At time $t_6$, input signal in1 goes high. With input signal in1 and node e2 both high, the output of NAND gate 808, or node a2, transitions low. A low on the input to inverter 810 drives output signal out2, to a high state at time $t_7$.

As input signal in2 goes high, PMOS transistor 828 turns off and NMOS transistor 826 turns on. However, node e2 continues to remain at a high state since PMOS transistor 812 is turned on pulling node e2 high and NMOS transistor 824 is off.

The transition of output signal out2 to a high state propagates through feedback path 804. A high on the input to inverter 818 drives node b2 low at time $t_8$. The falling edge transition on node b2 propagates through delay element 820 at time $t_9$, see node c2 in FIG. 9. The time delay through delay element 820 may be a programmable delay element. A programmable delay element may be include poly fuses, anti-fuses or any other kind of electrically fusible link to allow for a variable duty cycle (or pulse width) on the output signal out2. Delay element 23 of FIGS. 2 and 6 may also be programmable. The selection of a particular kind of electrically fusible link for a programmable delay element is within the knowledge of one of ordinary skill in the art, and thus, will not be further detailed herein.

The falling edge of node c2 propagates through inverter 822 as a rising edge on node d2 at time $t_{10}$, which consequently, turns on NMOS transistor 824. With both NMOS transistors 824 and 826 turned on, node e2 is pulled low to ground potential at time $t_{11}$. The low input (node e2) to inverter 814 drives node f2 high at time $t_{12}$, turning off PMOS transistor 812 and also turning on NMOS transistor 816, and consequently pulling output signal out2 to ground potential at time $t_{13}$. A falling edge on input signal in2, at time $t_{14}$, turns on PMOS transistor 828 and turns off NMOS transistor 826, and consequently pulling node e2 to a high state at time $t_{15}$. The high state of node e2 causes the output of inverter 814 (node f2) to fall low at time $t_{16}$, completing the cycle and bringing the clock generator 800 to the initial steady state (the same as at time $t_5$).

Clock generator 800 has two fewer components (i.e., the inverting input buffer 3 and NAND gate 5) relative to the SDRAM clock generator 1. Similarly, another advantage of clock generator 800 versus clock generator 600 is the lack of NAND gate 5, for a reduced component count. By reducing the number of components, less die space is consumed, ultimately resulting in reduced cost of the integrated circuit for which the inventive clock generators 1, 600 and 800 are used.

Although this invention has been described with reference to particular embodiments, the invention is not limited to these described embodiments. Rather, it should be understood that the embodiments described herein are merely exemplary and that a person skilled in the art may make many variations and modifications without departing from the spirit and scope of the invention. All such variations and modifications are intended to be included within the scope of the invention as defined in the appended claims.

What is claimed is:

1. A clock generator comprising:
   a latch for receiving an input clock signal;
   a delay path operably coupled to the latch for propagating a leading pulse edge of the input clock signal to an input of the latch and outputting a corresponding leading pulse edge of an output clock signal, said delay path including a programmable delay element; and
   a feedback path interposed between the delay path and the latch for returning the leading pulse edge of the output clock signal to the latch to reset the latch and cause the delay path to propagate and output a trailing pulse edge of the output clock signal.

2. The clock generator of claim 1, further comprising an inverting input buffer operably coupled to the latch for preconditioning the input clock signal for the latch.

3. The clock generator of claim 1 wherein the latch comprises a Set-Reset (SR) flip-flop including a pair of NAND gates.

4. The clock generator of claim 1 wherein the delay path comprises at least one inverter.

5. The clock generator of claim 1 wherein the feedback path comprises:
   a first inverter operably coupled to the delay path;
   said programmable delay element operably coupled to an output of the first inverter;
   a second inverter operably coupled to an output of the delay element; and
   a first NMOS transistor with its gate operably coupled to an output of the second inverter, its source operably coupled to ground, and its drain operably coupled to the latch for returning the leading pulse edge of the output clock signal thereto.

6. A clock generator comprising:
   a NAND gate for receiving an input clock signal;
   an output switching circuit operably coupled to said NAND gate for outputting a leading pulse edge of an output clock signal in response to a leading pulse edge of an input clock signal; and
   a feedback circuit including a programmable delay element interposed between said NAND gate and said output switching circuit for delaying said leading pulse edge of the output clock signal and selectively resetting said NAND gate in response to said delayed leading pulse edge of said output clock signal to propagate a trailing pulse edge of said output clock signal through said output switching circuit.

7. The clock generator of claim 6, wherein said output switching circuit comprises:
   a first inverter with input operably coupled to a first input of said NAND gate;
   a PMOS transistor with its source operably coupled to power, its drain operably coupled to said first input of said NAND gate, and its gate operably coupled to an output of the first inverter;
   an NMOS transistor with its drain operably coupled to said output clock signal, its gate operably coupled to said first inverter output, and its source operably coupled to ground; and
   a second inverter operably coupled to an output of said NAND gate and driving said output clock signal.

8. The clock generator of claim 6, wherein said feedback circuit comprises:
   a first inverter operably coupled to said output clock signal;
   a delay element operably coupled to an output of said first inverter;
   a second inverter operably coupled to an output of said delay element; and
   a first NMOS transistor with its gate operably coupled to an output of said second inverter, its source operably coupled to ground, and its drain operably coupled to said NAND gate for returning said leading pulse edge of said output clock signal thereto.

9. The clock generator of claim 8, further comprising:
   a PMOS transistor with its source coupled to power and its gate operably coupled to said input clock signal; and
   a second NMOS transistor with its drain operably coupled to a drain of said PMOS transistor and also operably coupled to an input of said NAND gate, a source of said second NMOS transistor operably coupled to said drain of said first NMOS transistor, and a gate of said second NMOS operably coupled to said input clock signal.

10. The clock generator of claim 8, wherein said delay element is said programmable delay element.

11. The clock generator of claim 9, wherein said programmable delay element is selected from the group including poly fuses and anti-fuses.

12. An input buffer comprising:
a latch for receiving an input clock signal;
an output switching circuit operably coupled to said latch for outputting a leading pulse edge of an output clock signal in response to a leading pulse edge of said input clock signal latched by said latch and returning said output leading pulse edge to an input of said latch; and
a feedback circuit interposed between said latch and said output switching circuit including a programmable delay element for selectively delaying said leading pulse edge of said output clock signal and selectively resetting said latch in response to said delayed leading pulse edge of said output clock signal to selectively propagate a trailing pulse edge of said output clock signal through said output switching circuit.

13. The input buffer of claim 12, further comprising an inverting input buffer operably coupled to said latch for preconditioning said input clock signal for said latch.

14. The input buffer of claim 12, wherein said latch comprises a Set-Reset (SR) flip-flop including a pair of NAND gates.

15. The input buffer of claim 12, wherein said latch comprises a NAND gate.

16. The input buffer of claim 12, wherein said output switching circuit comprises:
a first inverter with input operably coupled to an input of said latch;
a PMOS transistor with its source operably coupled to power, its drain operably coupled to an input of said latch, and its gate operably coupled to an output of said first inverter;
an NMOS transistor with its drain operably coupled to said output clock signal, its gate operably coupled to said output of said first inverter, and its source operably coupled to ground; and
a second inverter operably coupled to and output of said latch and driving said output clock signal.

17. The input buffer of claim 12, wherein said feedback circuit comprises:
a first inverter operably coupled to said output clock signal;
said programmable delay element operably coupled to an output of said first inverter;
a second inverter operably coupled to an output of said programmable delay element; and
a first NMOS transistor with its gate operably coupled to an output of said second inverter, its source operably coupled to ground, and its drain operably coupled to said latch for returning said leading pulse edge of said output clock signal thereto.

18. The input buffer of claim 17, wherein said programmable delay element is selected from the group including poly fuses and anti-fuses.

19. The input buffer of claim 17, further comprising:
a PMOS transistor with its source coupled to power and its gate operably coupled to said input clock signal; and
a second NMOS transistor with its drain operably coupled to a drain of said PMOS transistor and also operably coupled to an input of said latch, a source of said second NMOS transistor operably coupled to said drain of said first NMOS transistor, and a gate of said second NMOS operably coupled to said input clock signal.

20. A semiconductor memory including a clock generator, said clock generator comprising:
a latch for receiving an input clock signal;
an output switching circuit operably coupled to an output of said latch for outputting a leading pulse edge of an output clock signal in response to a leading pulse edge of said input clock signal and returning said output leading pulse edge to an input of said latch; and
a feedback circuit interposed between said latch and said output switching circuit including a programmable delay element for selectively delaying said leading pulse edge of said output clock signal and selectively resetting said latch in response to said selectively delayed leading pulse edge of said output clock signal to selectively propagate a trailing pulse edge of said output clock signal through said output switching circuit.

21. The semiconductor memory of claim 20 wherein said feedback circuit comprises:
a first inverter operably coupled to said output clock signal;
said programmable delay element operably coupled to an output of said first inverter;
a second inverter operably coupled to an output of said programmable delay element; and
a first NMOS transistor with its gate operably coupled to an output of said second inverter, its source operably coupled to ground, and its drain operably coupled to said latch for returning said leading pulse edge of said output clock signal thereto.

22. The semiconductor memory of claim 21, wherein said programmable delay element is selected from the group including poly fuses and anti-fuses.

23. The semiconductor memory of claim 21, further comprising:
a PMOS transistor with its source coupled to power and its gate operably coupled to said input clock signal; and
a second NMOS transistor with its drain operably coupled to a drain of said PMOS transistor and also operably coupled to an input of said latch, a source of said second NMOS transistor operably coupled to said drain of said first NMOS transistor, and a gate of said second NMOS operably coupled to said input clock signal.

24. The semiconductor memory of claim 20, wherein said semiconductor memory is selected from the group including dynamic random access memory (DRAM), double data rate SDRAM (DDR SDRAM), RAMBUS® DRAM (RDRAM®), extended data-out DRAM (EDO DRAM), fast-page-mode DRAM (FPM DRAM), static random access memory (SRAM), SyncBurst™ SRAM Zero Bus Turnaround™ SRAM (SBT™ SRAM), Quad Data Rate™ SRAM (QDR™ SRAM), DDR synchronous SRAM (DDR SRAM) and nonvolatile electrically block-erasable programmable read only memory (Flash).

25. An electronic system comprising an input device, an output device, a memory device, and a processor device operably coupled to said input, said output, and said memory devices, said memory device including a clock generator comprising:
a latch for receiving an input clock signal;
an output switching circuit operably coupled to an output of said latch for outputting a leading pulse edge of an output clock signal in response to a leading pulse edge of said input clock signal and returning said output leading pulse edge to an input of said latch; and a feedback circuit interposed between said latch and said output switching circuit including a programmable delay element for selectively delaying said leading pulse edge of said output clock signal and selectively resetting said latch in response to said selectively delayed leading pulse edge of said output clock signal to selectively propagate a trailing pulse edge of said output clock signal through said output switching circuit.

26. The electronic system of claim 25, wherein said feedback circuit comprises:

a first inverter operably coupled to said output clock signal;

said programmable delay element operably coupled to an output of said first inverter;

a second inverter operably coupled to an output of said programmable delay element; and a first NMOS transistor with its gate operably coupled to an output of said second inverter, its source operably coupled to ground, and its drain operably coupled to said latch for returning said leading pulse edge of said output clock signal thereto.

27. The electronic system of claim 26, wherein said programmable delay element is selected from the group including poly fuses and anti-fuses.

28. The electronic system of claim 26, further comprising:

a PMOS transistor with its source coupled to power and its gate operably coupled to said input clock signal; and a second NMOS transistor with its drain operably coupled to a drain of said PMOS transistor and also operably coupled to an input of said latch, a source of said second NMOS transistor operably coupled to said drain of said first NMOS transistor, and a gate of said second NMOS operably coupled to said input clock signal.

29. The electronic system of claim 26, wherein said semiconductor memory is selected from the group including dynamic random access memory (DRAM), double data rate SDRAM (DDR SDRAM), RAMBUS® DRAM (RDRAM®g), extended data-out DRAM (EDO DRAM), fast-page-mode DRAM (FPM DRAM), static random access memory (SRAM), SyncBurst™ SRAM, Zero Bus Turnaround™ SRAM (SBT™ SRAM), Quad Data Rate™ SRAM (QDR™ SRAM), DDR synchronous SRAM (DDR SRAM) and nonvolatile electrically block-erasable programmable read only memory (Flash).

30. A semiconductor substrate having a clock generator fabricated thereon, said clock generator comprising:

a latch for receiving an input clock signal;

an output switching circuit operably coupled to an output of said latch for outputting a leading pulse edge of an output clock signal in response to a leading pulse edge of said input clock signal and returning said output leading pulse edge to an input of said latch; and a feedback circuit interposed between said latch and said output switching circuit including a programmable delay element for selectively delaying said leading pulse edge of said output clock signal and selectively resetting said latch in response to said selectively delayed leading pulse edge of said output clock signal to selectively propagate a trailing pulse edge of said output clock signal through said output switching circuit.

31. The semiconductor substrate of claim 30, wherein said feedback circuit comprises:

a first inverter operably coupled to said output clock signal;

said programmable delay element operably coupled to an output of said first inverter;

a second inverter operably coupled to an output of said programmable delay element; and a first NMOS transistor with its gate operably coupled to an output of said second inverter, its source operably coupled to ground, and its drain operably coupled to said latch for returning said leading pulse edge of said output clock signal thereto.

32. The semiconductor substrate of claim 31, further comprising:

a PMOS transistor with its source coupled to power and its gate operably coupled to said input clock signal; and a second NMOS transistor with its drain operably coupled to a drain of said PMOS transistor and also operably coupled to an input of said latch, a source of said second NMOS transistor operably coupled to said drain of said first NMOS transistor, and a gate of said second NMOS operably coupled to said input clock signal.

33. The semiconductor substrate of claim 31, wherein said programmable delay element is selected from the group including poly fuses and anti-fuses.

34. A method of generating a clock signal comprising:

providing a latch for receiving an input clock signal;

providing a programmable delay path for propagating a leading pulse edge of said input clock signal and outputting a corresponding leading pulse edge of an output clock signal;

providing a feedback path for returning said leading pulse edge of said output clock signal to said latch and outputting a trailing pulse edge of said output clock signal.

35. A method of generating a clock signal comprising:

latching a leading edge of an input clock signal;

outputting a leading edge of an output clock signal in response to said leading edge of said input clock signal;

returning and selectively delaying said leading edge of the output clock signal; and outputting a trailing edge of said output clock signal in response to said delayed leading edge of said output clock signal.

36. A method of generating a delayed pulse signal using an electronic circuit including a NAND gate, a delay path, and a feedback path, said method comprising:

latching an input clock signal with said NAND gate;

outputting a leading edge of an output clock signal through said delay path;

returning and selectively delaying said leading edge of said output clock signal to said NAND gate through said feedback path; and outputting a trailing edge of said output clock signal in response to said delayed leading edge of said output clock signal.

* * * * *

UNITED STATES PATENT AND TRADEMARK OFFICE
CERTIFICATE OF CORRECTION

PATENT NO. : 6,445,644 B2
DATED : September 3, 2002
INVENTOR(S) : Joseph C. Sher It is certified that error appears in the above-identified patent and that said Letters Patent is hereby corrected as shown below:

Drawings,
Drawing sheet, consisting of Figs 1 through 9, Fig. 4 should be deleted to be replaced with Figs. 4, as shown below.

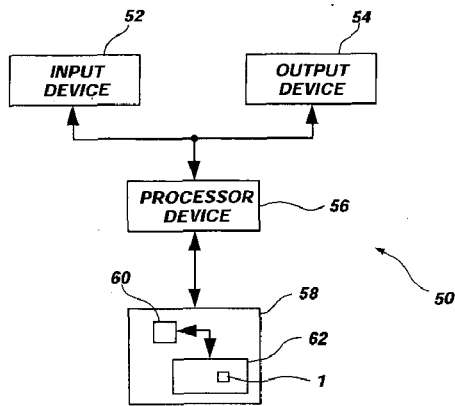

Fig. 4

Column 1,
Line 27, change "SI)RAM" to -- SDRAM --

Column 2,
Line 6, change "(Atr)" to -- ($\Delta t_r$) --
Line 8, change "CIKA" to -- CLKA --
Line 41, after "high" and before "in" change "." to -- , --

Column 3,
Line 58, change "to" to -- $t_0$ --

Column 4,
Line 27, change "CIKY" to -- CLKY --

Column 5,
Line 20, after "CLKY" insert -- . --

UNITED STATES PATENT AND TRADEMARK OFFICE
CERTIFICATE OF CORRECTION

PATENT NO.  : 6,445,644 B2
DATED       : September 3, 2002
INVENTOR(S) : Joseph C. Sher It is certified that error appears in the above-identified patent and that said Letters Patent is hereby corrected as shown below:

Column 9,
Line 39, after "to" and before "output" change "and" to -- an --
Line 67, after "NMOS" and before "operably" insert -- transistor --

Column 10,
Line 51, after "SRAM" and before "Zero" insert -- , --

Signed and Sealed this

Thirtieth Day of November, 2004

JON W. DUDAS
*Director of the United States Patent and Trademark Office*